(12) United States Patent
Que et al.

(10) Patent No.: US 8,414,307 B2
(45) Date of Patent: Apr. 9, 2013

(54) CONNECTION STRUCTURE HAVING A PRINTED CIRCUIT BOARD WITH A PROTRUSION ENGAGING A RECEIVING PORTION OF A SECOND CIRCUIT BOARD

(75) Inventors: Chengwen Que, Shenzhen (CN); Yicheng Kuo, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 0 days.

(21) Appl. No.: 13/259,285

(22) PCT Filed: Jul. 14, 2011

(86) PCT No.: PCT/CN2011/077172
§ 371 (c)(1),
(2), (4) Date: Sep. 23, 2011

(87) PCT Pub. No.: WO2013/007032
PCT Pub. Date: Jan. 17, 2013

(65) Prior Publication Data
US 2013/0017692 A1    Jan. 17, 2013

(51) Int. Cl.
*H01R 12/00* (2006.01)
(52) U.S. Cl. .......................................................... 439/65
(58) Field of Classification Search ................ 439/64–67
See application file for complete search history.

(56) References Cited

U.S. PATENT DOCUMENTS

| | | | | |
|---|---|---|---|---|
| 6,033,234 A | * | 3/2000 | Wang et al. | 439/67 |
| 6,114,221 A | * | 9/2000 | Tonti et al. | 438/455 |
| 6,562,504 B2 | * | 5/2003 | Faris et al. | 429/404 |
| 2006/0234521 A1 | | 10/2006 | Uchida et al. | |

FOREIGN PATENT DOCUMENTS

| | | |
|---|---|---|
| CN | 1781346 A | 5/2006 |
| CN | 201853841 U | 6/2011 |
| JP | 2006-260803 A | 9/2006 |

* cited by examiner

*Primary Examiner* — Chandrika Prasad
(74) *Attorney, Agent, or Firm* — Ditthavong Mori & Steiner, P.C.

(57) ABSTRACT

The present invention relates to a technology field of a printed circuit board, and more particularly to a connection structure of a printed circuit board and a connection method thereof. The connection structure of the printed circuit board of the present invention comprises a first and second printed circuit boards. One end of the first printed circuit board disposes a receiving portion. One end of the second printed circuit board disposes a protruding portion. The shape of the protruding portion is corresponding to that of the receiving portion. When connecting the first and second printed circuit boards, the protruding portion is engaged with the receiving portion so that realizing a physical connection. The connection structure and the connection method may reduce the product cost. Moreover, the printed circuit boards connected by the solution of the present invention can be conveniently mounted and dismounted to simplify the operation.

15 Claims, 3 Drawing Sheets

CONNECTION STRUCTURE HAVING A PRINTED CIRCUIT BOARD WITH A PROTRUSION ENGAGING A RECEIVING PORTION OF A SECOND CIRCUIT BOARD

BACKGROUND OF THE INVENTION

1. Field of the Invention

The present invention relates to a technology field of a printed circuit board, and more particularly to a connection structure of a printed circuit board and a connection method thereof.

2. Description of the Prior Art

Existing electronic products, such as a television, a digital camera, a mobile phone and so on, mostly adopt a printed circuit board (PCB). Under the condition of one product having multiple PCBs, the multiple PCBs may need to be connected together.

In the prior art, a universal connection mode between the PCBs is disposing an edge board connector on each PCB, and then employing an FFC (Flexible Flat Cable), an FPC (Flexible Printed Circuit), a Cable and so on to realize the connection between the PCBs.

The existing connection mode between the PCBs also has an issue of high cost in addition to the operation being complex. Particularly under the condition of needing a simple circuit design, for example, in a backlight module of a liquid crystal display (LCD), a connection between printed circuit boards of a light emitting diode light-bar (LED light-bar) usually only needs to satisfy the linking between the PCBs and the normal circuit conduction. Though the circuit of the PCB is not very complex, all the connections through the FFC, the FPC or the Cable can result in the problem of the cost being over high.

Hence, it is needed to provide a connection structure of a printed circuit board and a connection method thereof to solve the above problem.

BRIEF SUMMARY OF THE INVENTION

The present invention provides a connection structure of a printed circuit board and a connection method thereof to solve the problems of complex operation and high cost of the prior PCB connection.

An object of the present invention is to provide a connection structure of a printed circuit board and a connection method thereof, which can reduce the product cost and be conveniently mounted and dismounted for being of advantage to simplify the operation.

The other objects and the advantages of the present invention may be further understood from the technical features disclosed by the present invention. To achieve the aforementioned object or other objects of the present invention, the present invention adopts the following technical solution.

A connection structure of a printed circuit board comprises:

a first printed circuit board, one end of which disposes a receiving portion;

a second printed circuit board, one end of which disposes a protruding portion;

the shape of the protruding portion being corresponding to that of the receiving portion; when connecting the first printed circuit board to the second printed circuit board, the protruding portion being engaged with the receiving portion so that forming a physical connection between the first printed circuit board and the second printed circuit board; the first printed circuit board also disposing a copper-exposed area connected to a circuit thereof, the second printed circuit board also disposing a conductive spring finger connected to a circuit thereof; when connecting the first printed circuit board to the second printed circuit board, the conductive spring finger being elastically connected to the copper-exposed area so that forming an electrical connection between the first printed circuit board and the second printed circuit board; and the number of the protruding portion being two or more, and the number of the receiving portion being the same as that of the protruding portion.

In one preferred embodiment of the present invention, the receiving portion is a groove, the protruding portion is a protrusion, and the shape of the groove is corresponding to that of the protrusion; when connecting the first and second printed circuit boards, the protrusion is jammed into the groove for forming the physical connection between the first and second printed circuit boards.

In one preferred embodiment of the present invention, the number of the protrusion is two or more, and the number of the groove is the same as that of the protrusion.

In one preferred embodiment of the present invention, the receiving portion is a hole, the protruding portion is a cylinder, and the shape of the cylinder is corresponding to that of the hole; when connecting the first and second printed circuit boards, the cylinder is inserted into the hole for forming the physical connection between the first and second printed circuit boards.

In one preferred embodiment of the present invention, the number of the hole is two or more, and the number of the cylinder is the same as that of the hole.

The present invention also provides another connection structure of a printed circuit board, comprising: a first printed circuit board and a second printed circuit board. One end of the first printed circuit board disposes a receiving portion. One end of the second printed circuit board disposes a protruding portion, and the shape of the protruding portion is corresponding to that of the receiving portion. When connecting the first printed circuit board and the second printed circuit board, the protruding portion is engaged with the receiving portion for forming a physical connection between the first printed circuit board and the second printed circuit board.

In one preferred embodiment of the present invention, the receiving portion is a groove, the protruding portion is a protrusion, and the shape of the groove is corresponding to that of the protrusion; when connecting the first and second printed circuit boards, the protrusion is jammed into the groove for forming the physical connection between the first and second printed circuit boards.

In one preferred embodiment of the present invention, the number of the protrusion is two or more, and the number of the groove is the same as that of the protrusion.

In one preferred embodiment of the present invention, the receiving portion is a hole, the protruding portion is a cylinder, and the shape of the cylinder is corresponding to that of the hole; when connecting the first and second printed circuit boards, the cylinder is inserted into the hole for forming the physical connection between the first and second printed circuit boards.

In one preferred embodiment of the present invention, the number of the hole is two or more, and the number of the cylinder is the same as that of the hole.

In one preferred embodiment of the present invention, the section of the hole is square, circular or triangle, and the sectional shape of the cylinder is corresponding to that of the hole.

In one preferred embodiment of the present invention, the first printed circuit board disposes a copper-exposed area connected to a circuit thereof, and the second printed circuit board disposes a conductive spring finger connected to a circuit thereof; when connecting the first and second printed circuit boards, the conductive spring finger is elastically connected to the copper-exposed area for forming the electrical connection between the first and second printed circuit boards.

In one preferred embodiment of the present invention, the second printed circuit board disposes a copper-exposed area connected to a circuit thereof, and the first printed circuit board disposes a conductive spring finger connected to a circuit thereof; when connecting the first and second printed circuit boards, the conductive spring finger is elastically connected to the copper-exposed area for forming the electrical connection between the first and second printed circuit boards.

The present invention also provides a connection method of a printed circuit board. The method comprises:

fixing a first printed circuit board on an object position of a waiting assembly product; and connecting a second printed circuit board to the first printed circuit board, a protruding portion formed on one end of the second printed circuit board being engaged with a receiving portion formed on one end of the first printed circuit board so that forming a physical connection of the first printed circuit board and the second printed circuit board.

In one preferred embodiment of the present invention, the method further comprises:

a conductive spring finger formed on the second printed circuit board being elastically contacted with a copper-exposed area of the first printed circuit board so that electrically connecting the first and second printed circuit boards.

Comparing with the prior connection structure of the printed circuit board, the connection structure of the printed circuit board and the connection method thereof provided by the present invention, when connecting two or more printed circuit boards, can realize a physical connection by the engagement of the protruding portion and the receiving portion on the printed circuit boards, and simultaneously can realize an electrical connection by the engagement of the copper-exposed area and the conductive spring finger on the printed circuit boards. Therefore, comparing with the prior connection mode of the printed circuit board, the connection structure of the printed circuit board and the connection method thereof in the present invention can omit an edge board connector, a wire connector, a connection wire and the like to reduce the product cost. Moreover, the printed circuit boards connected together by the solution of the present invention can be conveniently mounted and dismounted to simplify the operation.

For more clearly and easily understanding above content of the present invention, the following text will take a preferred embodiment of the present invention with reference to the accompanying drawings for detail description as follows.

DETAILED DESCRIPTION OF THE PREFERRED EMBODIMENTS

The following description of every embodiment with reference to the accompanying drawings is used to exemplify a specific embodiment, which may be carried out in the present invention. Directional terms mentioned in the present invention, such as "top", "bottom", "front", "back", "left", "right", "inside", "outside", "side" etc., are only used with reference to the orientation of the accompanying drawings. Therefore, the used directional terms are intended to illustrate, but not to limit, the present invention.

A connection structure of a printed circuit board provided by an embodiment of the present invention adopts two printed circuit boards (PCBs). One end of one PCB (to be named as a first PCB) disposes a receiving portion, and one end of the other PCB (to be named as a second PCB) disposes a protruding portion corresponding to the receiving portion. The protruding portion and the receiving portion may be connected and engaged with each other when connecting the two PCBs, so that realizing a physical connection between the two PCBs. Moreover, one end of one (such as the first PCB) of the two PCBs disposes a copper-exposed area, and one end of the other (such as the second PCB) of the two PCBs disposes a conductive spring finger. When connecting the two PCBs, the copper-exposed area and the conductive spring finger can be elastically contacted with each other so that realizing an electrical connection between the two PCBs.

Figure 1:
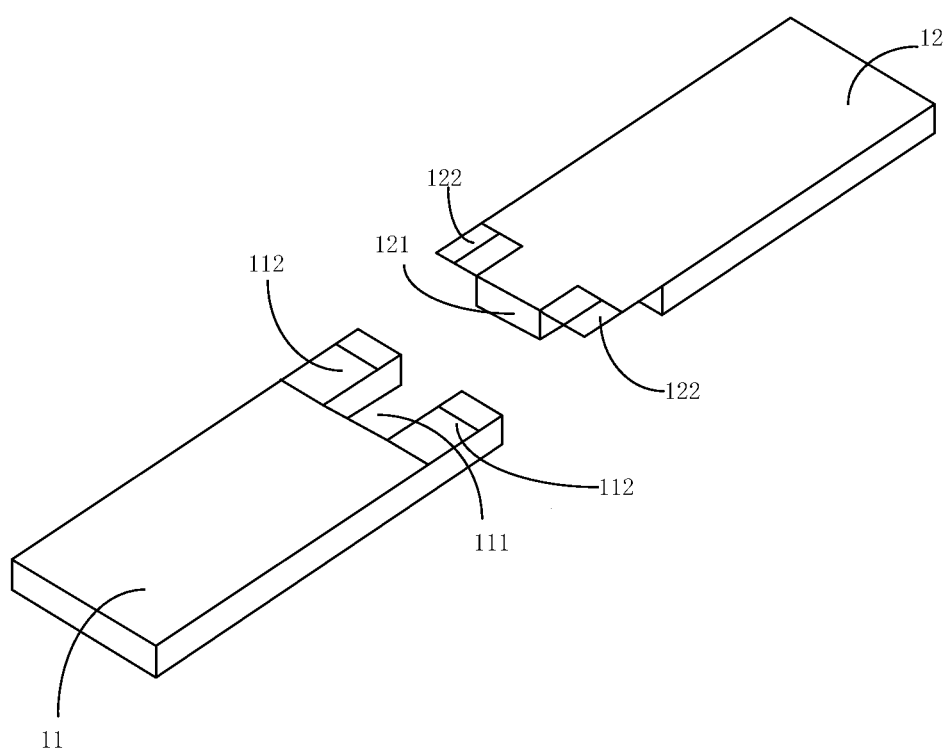
FIG. 1 is a schematic view of a connection structure of a printed circuit board of a first embodiment of the present invention.

As shown in FIG. 1, it shows a schematic view of a first embodiment of a connection structure of a printed circuit board provided by the present invention. In this embodiment, a first PCB 11 disposes a receiving portion thereon, the shape of which is a groove. A second PCB 12 disposes a protruding portion thereon, the shape of which is a protrusion. Specifically, in FIG. 1, one end of the first PCB 11 disposes a groove 111. The groove 111 is used as the receiving portion. The groove 111 is disposed on a middle position of the one end of the first PCB 11. The first PCB 11 disposes a copper-exposed area 112 on the one end thereof having the groove 111 and on two sides of the groove 111. One copper-exposed surface of the copper-exposed area 112 faces upward. The copper-exposed area 112 is connected to a circuit of the first PCB 11. One end of the second PCB 12 disposes a protrusion 121. The protrusion 121 is namely the protruding portion. The protrusion 121 is disposed on a middle position of the one end of the second PCB 12. The shape of the protrusion 121 is corresponding to that of the groove 111 of the first PCB 11. Namely, the shapes of the protrusion 121 and the groove 111 are complementary each other. The second PCB 12 disposes a conductive spring finger 122 on the one end thereof having the protrusion 121 and on two sides of the protrusion 121. The conductive spring finger 122 is connected to a circuit of the second PCB 12.

When connecting the first PCB 11 and the second PCB 12, the first PCB 11 and the second PCB 12 are jointed together, the groove 111 on the first PCB 11 is engaged with the protrusion 121 on the second PCB 12, and the protrusion 121 is jammed into the groove 111, thereby realizing a physical connection between the first PCB 11 and the second PCB 12. Moreover, in addition to the engagement of the groove 111 on the first PCB 11 and the protrusion 121 on the second PCB 12, the copper-exposed area 112 on the first PCB 11 is engaged with the conductive spring finger 122 on the second PCB 12, so that the copper-exposed area 112 and the conductive spring finger 122 can realize an elastic connection. Because the copper-exposed area 112 is connected to the circuit on the first PCB 11 and the conductive spring finger 122 is connected to the circuit on the second PCB 12, when the conductive spring finger 122 and the copper-exposed area 112 being elastically connected, the first PCB 11 and the second PCB 12 may realize an electrical connection.

Figure 2:
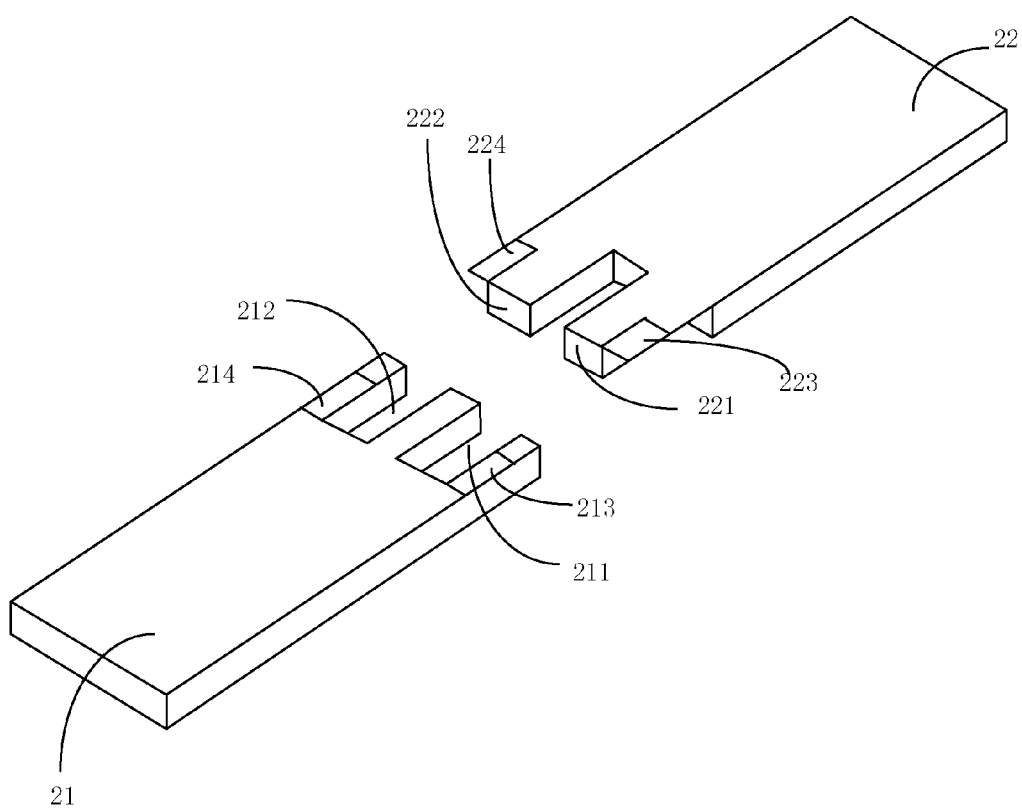
FIG. 2 is a schematic view of a connection structure of a printed circuit board of a second embodiment of the present invention.

As shown in FIG. 2, it shows a structural view of a second embodiment of a connection structure of a printed circuit board provided by the present invention. In this embodiment, a first PCB 21 disposes a receiving portion thereon, the shape of which is a groove. A second PCB 22 disposes a protruding portion thereon, the shape of which is a protrusion. Specifically, in FIG. 2, one end of the first PCB 21 disposes a groove 211 and a groove 212. The two grooves 211, 212 are used as the receiving portion. In specifically carrying out the technology solution provided by the present invention, the number of the grooves used as the receiving portion also may be larger than two. Namely, the number of the grooves is determined by the actual demand. In the second embodiment shown in FIG. 2, the two grooves 211, 212 are disposed on the one end of the first PCB 21, and there forms a space between the two grooves 211, 212. The first PCB 21 disposes two copper-exposed areas 213, 214 on the one end thereof having the two grooves 211, 212 and on the positions having no the two copper-exposed areas 213, 214. Copper-exposed surfaces of the two copper-exposed areas 213, 214 face upward, and the two copper-exposed areas 213, 214 are connected to a circuit of the first PCB 21.

One end of the second PCB 22 disposes two protrusions 221, 222. The two protrusions 221, 222 are disposed on the one end of the second PCB 22. The shape of the protrusions 221 is corresponding to that of the groove 211, and the shape of the protrusion 222 is corresponding to that of the groove 212. In other words, the shapes of the two protrusions 221, 222 are complementary with those of the two grooves 211, 212. The second PCB 22 disposes two conductive spring fingers 223, 224 on the one end thereof having the two protrusions 221, 222 and on the positions having no the two protrusions 221, 222. The two conductive spring fingers 223, 224 are connected to a circuit of the second PCB 22.

When connecting the first PCB 21 and the second PCB 22, the first PCB 21 and the second PCB 22 are jointed together, the groove 211 on the first PCB 21 is engaged with the protrusion 221 on the second PCB 22, the protrusion 221 is jammed into the groove 211, the groove 212 on the first PCB 21 is engaged with the protrusion 222 on the second PCB 22, and the protrusion 222 is jammed into the groove 212, thereby realizing a physical connection between the first PCB 21 and the second PCB 22. Moreover, in addition to the engagement of the two grooves 211, 212 on the first PCB 21 and the two protrusions 221, 222 on the second PCB 22, the copper-exposed area 213 on the first PCB 21 is engaged with the conductive spring finger 223 on the second PCB 22 so that realizing an elastic contact between the copper-exposed area 213 and the conductive spring finger 223, and the copper-exposed area 214 on the first PCB 21 is engaged with the conductive spring finger 224 on the second PCB 22 so that realizing an elastic contact between the copper-exposed area 214 and the conductive spring finger 224. Because the two copper-exposed area 213, 214 are connected to the circuit on the first PCB 21, and the two conductive spring fingers 223, 224 are connected to the circuit on the second PCB 22, when the conductive spring finger 223 and the copper-exposed area 213 being elastically connected and the conductive spring finger 224 and the copper-exposed area 214 being elastically connected, the first PCB 21 and the second PCB 22 may realize an electrical connection.

When implementing the technical solution of the present invention, the receiving portion in the first and second embodiments may be a hole, the section of which may be circular, square, triangle or other shapes, but the shape of the protruding portion needs to be corresponding to that of the receiving portion. For example, the protruding portion may be a cylinder, the section of which may be circular, square or other shapes. When connecting the two PCBs, the two PCBs are jointed together, the hole on the first PCB is engaged with the cylinder on the second PCB, and the cylinder is inserted into the hole, so that realizing a physical connection between the first PCB and the second PCB.

Similarly, the electrical connection mode between the first PCB and the second PCB is the same as that in the first embodiment and the second embodiment. Namely, it also realizes the electrical connection by the elastic connection of the copper-exposed area and the conductive spring finger.

Figure 3:
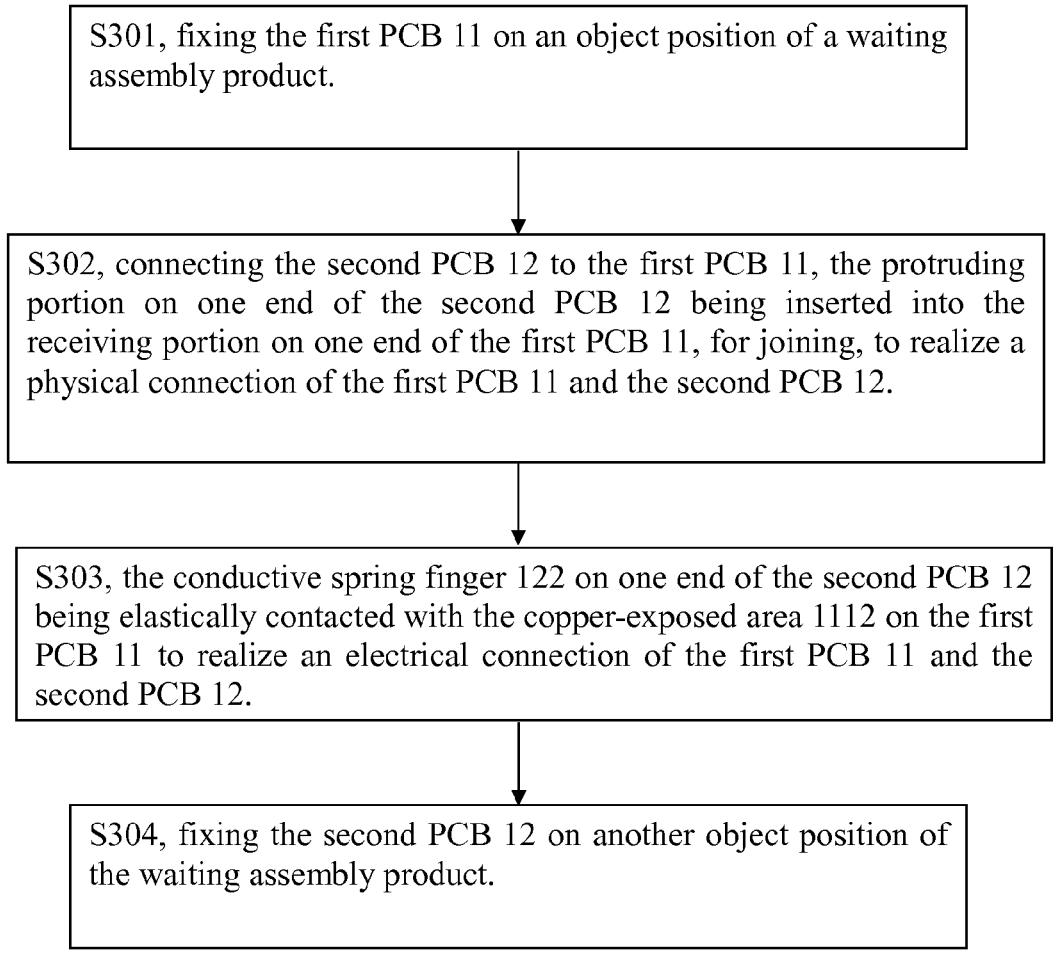
FIG. 3 is a flow chart of a preferred embodiment of a connection method of a printed circuit board of the present invention.

As shown in FIG. 3, it shows a flow chart of a preferred embodiment of a connection method of a printed circuit board provided by the present invention. For more clearly describing the connection method of the printed circuit board of the present invention, in this embodiment, the connection method of the printed circuit board shown in FIG. 3 will be detailed described with reference to the connection structure of the printed circuit board and the reference numerals of the elements thereof. The connection method of the printed circuit board of the present invention provides the first PCB 11 and the second PCB 12, wherein one end of the first PCB 11 disposes the receiving portion (namely the groove 111) and one end of the second PCB 12 disposes the protruding portion (namely the protrusion 121) corresponding to the receiving portion. The first PCB 11 disposes the copper-exposed area 112 on the one end thereof having the receiving portion, and the second PCB 12 disposes the conductive spring finger 122 on the one end thereof having the protruding portion.

Specifically, the connection method of the printed circuit board of this embodiment comprises the following steps:

S301, fixing the first PCB 11 on an object position of a waiting assembly product;

S302, connecting the second PCB 12 to the first PCB 11, the protruding portion on one end of the second PCB 12 being inserted into the receiving portion on one end of the first PCB 11 for joining, to realize a physical connection of the first PCB 11 and the second PCB 12;

S303, the conductive spring finger 122 on one end of the second PCB 12 being elastically contacted with the copper-exposed area 1112 on the first PCB 11 to realize an electrical connection of the first PCB 11 and the second PCB 12; and S304, fixing the second PCB 12 on another object position of the waiting assembly product.

Wherein, the step of S301 may fix the first PCB 11 on the object position of the waiting assembly product by a mechanical way, such as screw, adhering or other ways. The step of S304 also may fix the second PCB 12 on another object position of the waiting assembly product by a mechanical way, such as screw, adhering or other ways.

In other embodiments, the disposing mode of the copper-exposed area and the conductive spring finger may not be limited to above illustrated mode of the embodiments shown in FIGS. 1 and 2, but it may be that the copper-exposed area is disposed on the second PCB having the protruding portion and correspondingly the conductive spring finger is disposed on the first PCB having the receiving portion, so that also realizing the electrical connection between the two PCB.

As described above, when connecting two or multiple PCB, the connection structure and the connection method of the printed circuit board of the present invention not only can realize a physical connection by the engagement of the protruding portion and the receiving portion on the PCBs, but also can realize an electrical connection by the engagement of the copper-exposed area and the conductive spring finger on the PCBs. Comparing with the prior PCB connection mode, the connection structure and the connection method of the printed circuit board of the present invention may omit an edge board connector, a wire connector, a connection wire and the like to reduce the product cost. Moreover, the PCBs connected together by the solution of the present invention can be conveniently mounted and dismounted to simplify the operation.

In conclusion, although the present invention has been disclosed by above preferred embodiments, above preferred embodiments are not used to limit the present invention. One of ordinary skills in the art also can make all sorts of improvements and amendments within the principles of the present invention. Therefore, the protection scope of the present invention should be based on the scope defined by the appended claims.

What is claimed is:

1. A connection structure of a printed circuit board, characterized in that: the connection structure of the printed circuit board comprising:
    a first printed circuit board, one end of which disposes a receiving portion;
    a second printed circuit board, one end of which disposes a protruding portion;
    the perimeter of the protruding portion corresponding to that of the receiving portion wherein a physical connection between the first printed circuit board and the second printed circuit board is formed when connecting the first printed circuit board and the second printed circuit board by engaging the protruding portion with the receiving portion;
    the first printed circuit board also disposing a copper-exposed area connected to a circuit thereof, the second printed circuit board also disposing a conductive spring finger connected to a circuit thereof; wherein an electrical connection between the first printed circuit board and the second printed circuit board is formed when connecting the first printed circuit board and the second printed circuit board, with the conductive spring finger elastically connected to the copper-exposed area; and
    the number of the protruding portion being two or more, and the number of the receiving portion being the same as that of the protruding portion.

2. The connection structure of the printed circuit board as claimed in claim 1, characterized in that:
    the receiving portion is a groove, the protruding portion is a protrusion, and the shape of the groove is corresponding to that of the protrusion;
    when connecting the first and second printed circuit boards, the protrusion is jammed into the groove for forming the physical connection between the first and second printed circuit boards.

3. The connection structure of the printed circuit board as claimed in claim 2, characterized in that:
    the number of the protrusion is two or more, and the number of the groove is the same as that of the protrusion.

4. The connection structure of the printed circuit board as claimed in claim 1, characterized in that:
    the receiving portion is a hole, the protruding portion is a cylinder, and the shape of the cylinder is corresponding to that of the hole;
    when connecting the first and second printed circuit boards, the cylinder is inserted into the hole for forming the physical connection between the first and second printed circuit boards.

5. The connection structure of the printed circuit board as claimed in claim 4, characterized in that:
    the number of the hole is two or more, and the number of the cylinder is the same as that of the hole.

6. A connection structure of a printed circuit board, characterized in that: the connection structure of the printed circuit board comprising:
    a first printed circuit board, one end of which disposes a receiving portion; and
    a second printed circuit board, one end of which disposes a protruding portion, the perimeter of the protruding portion corresponding to that of the receiving portion; wherein the protruding portion engages with the receiving portion to form a physical connection between the first printed circuit board and the second printed circuit board when the first printed circuit board and the second printed circuit board are connected.

7. The connection structure of the printed circuit board as claimed in claim 6, characterized in that:
    the receiving portion is a groove, the protruding portion is a protrusion, and the shape of the groove is corresponding to that of the protrusion;
    when connecting the first and second printed circuit boards, the protrusion is jammed into the groove for forming the physical connection between the first and second printed circuit boards.

8. The connection structure of the printed circuit board as claimed in claim 7, characterized in that:
    the number of the protrusion is two or more, and the number of the groove is the same as that of the protrusion.

9. The connection structure of the printed circuit board as claimed in claim 6, characterized in that:
    the receiving portion is a hole, the protruding portion is a cylinder, and the shape of the cylinder is corresponding to that of the hole;
    when connecting the first and second printed circuit boards, the cylinder is inserted into the hole for forming the physical connection between the first and second printed circuit boards.

10. The connection structure of the printed circuit board as claimed in claim 9, characterized in that:
    the number of the hole is two or more, and the number of the cylinder is the same as that of the hole.

11. The connection structure of the printed circuit board as claimed in claim 9, characterized in that:
    the section of the hole is square, circular or triangle, and the sectional shape of the cylinder is corresponding to that of the hole.

12. The connection structure of the printed circuit board as claimed in claim 6, characterized in that:
    the first printed circuit board disposes a copper-exposed area connected to a circuit thereof, and the second printed circuit board disposes a conductive spring finger connected to a circuit thereof; when connecting the first and second printed circuit boards, the conductive spring finger is elastically connected to the copper-exposed area for forming the electrical connection between the first and second printed circuit boards.

13. The connection structure of the printed circuit board as claimed in claim 6, characterized in that:

the second printed circuit board disposes a copper-exposed area connected to a circuit thereof, and the first printed circuit board disposes a conductive spring finger connected to a circuit thereof; when connecting the first and second printed circuit boards, the conductive spring finger is elastically connected to the copper-exposed area for forming the electrical connection between the first and second printed circuit boards.

14. A connection method of a printed circuit board, characterized in that: the method comprising:

fixing a first printed circuit board on an object position of a waiting assembly product; and connecting a second printed circuit board to the first printed circuit board, where the perimeter of a protruding portion formed on one end of the second printed circuit board engages with a receiving portion formed on one end of the first printed circuit board to form a physical connection of the first printed circuit board and the second printed circuit board.

15. The connection method of the printed circuit board as claimed in claim 14, characterized in that: the method further comprises:

a conductive spring finger formed on the second printed circuit board being elastically contacted with a copper-exposed area of the first printed circuit board so that electrically connecting the first and second printed circuit boards.

\* \* \* \* \*